(12) United States Patent
Swain et al.

(10) Patent No.: US 6,884,290 B2
(45) Date of Patent: Apr. 26, 2005

(54) ELECTRICALLY CONDUCTIVE POLYCRYSTALLINE DIAMOND AND PARTICULATE METAL BASED ELECTRODES

(75) Inventors: Greg M. Swain, East Lansing, MI (US); Jian Wang, Westmont, IL (US)

(73) Assignee: Board of Trustees of Michigan State University, East Lansing, MI (US)

( * ) Notice: Subject to any disclaimer, the term of this patent is extended or adjusted under 35 U.S.C. 154(b) by 7 days.

(21) Appl. No.: 10/338,318

(22) Filed: Jan. 8, 2003

(65) Prior Publication Data

US 2004/0221796 A1 Nov. 11, 2004

Related U.S. Application Data

(60) Provisional application No. 60/347,675, filed on Jan. 11, 2002.

(51) Int. Cl.[7] ............................................. C30B 29/04
(52) U.S. Cl. ........................ 117/68; 117/929; 117/89; 423/446
(58) Field of Search ............................. 117/68, 929, 13, 117/19, 20; 423/446; 427/250, 577

(56) References Cited

U.S. PATENT DOCUMENTS

| | | |
|---|---|---|
| 5,209,916 A | 5/1993 | Gruen |
| 5,328,676 A | 7/1994 | Gruen |
| 5,370,855 A | 12/1994 | Gruen |
| 5,462,776 A | 10/1995 | Gruen |
| 5,571,577 A | 11/1996 | Zhang et al. |
| 5,620,512 A | 4/1997 | Gruen |
| 5,645,645 A | 7/1997 | Zhang et al. |
| 5,772,760 A | 6/1998 | Gruen et al. |
| 5,849,079 A | 12/1998 | Gruen et al. |
| 5,897,924 A | 4/1999 | Ulczynski et al. |
| 5,900,127 A | 5/1999 | Iida et al. |
| 5,902,640 A | 5/1999 | Krauss |
| 5,989,511 A | 11/1999 | Gruen et al. |
| 6,106,692 A | 8/2000 | Kunimatsu et al. |

OTHER PUBLICATIONS

G.M. Swain (Wang, J., et al., J. New Mater. Electrochem. Syst. 3 75 (2000).
Wang, J., et al., Electrochem. Solid–State Lett. 3 286 (2000).
Auer, W., et al., Appl. Catal., A, 173 259 (1998).
Witek, M., et al., J. Wide Bandgap Mater. vol. 8 No. 3–4 171–188 (Jan./Apr. 2001).
Xu, J., et al., Anal. Chem. 69, 591A (1997).
Swain, G.M., et al., MRS Bull. 23, 56 (1998).
Tenne, R., et al., Isr. J. Chem. 38 57 (1998).
Pleskov, Y.V., Russian Chemical Reviews 68 381 (1999).
Vinokur, N., et al., J. Electrochem. Soc. 143 L238 (1996).
Rao, T.N., et al., Anal. Chem. 71 2506 (1999).
Swain, G.M., J. Electrochem. Soc., 141 3382 (1994).
Chen, Q., et al., J. Electrochem. Soc., 144 3806 (1997).

Primary Examiner—Felisa Hiteshew
(74) Attorney, Agent, or Firm—Ian C. McLeod

(57) ABSTRACT

An electrically conducting and dimensionally stable diamond (12, 14) and metal particle (13) electrode produced by electrodepositing the metal on the diamond is described. The electrode is particularly useful in harsh chemical environments and at high current densities and potentials. The electrode is particularly useful for generating hydrogen, and for reducing oxygen and oxidizing methanol in reactions which are of importance in fuel cells.

11 Claims, 6 Drawing Sheets

ELECTRICALLY CONDUCTIVE POLYCRYSTALLINE DIAMOND AND PARTICULATE METAL BASED ELECTRODES

CROSS REFERENCE TO RELATED APPLICATION

This application claims priority to provisional application Ser. No. 60/347,675, filed Jan. 11, 2002.

GOVERNMENT RIGHTS

The research disclosed in this application was supported by the Department of Energy Grant No. DE-FG02-01ER15120. The U.S. government has certain rights to this invention.

BACKGROUND OF THE INVENTION (1) Field of the Invention

The present invention relates to a polycrystalline conductive diamond electrode with a particulate metal electrolytically deposited on and anchored in the diamond particles. In particular, the present invention relates to particulate platinum (Pt) or ruthenium (Ru) or rhodium (Rh) and nobel metal alloys thereof based diamond film electrodes. The diamond electrode can be used in fuel cells, electrosynthesis or electrochemical-based chemical contaminant remediation.

(2) Description of Related Art

The present invention uses a deposition process similar to that described by Gruen et al. See for example U.S. Pat. Nos. 5,989,511; 5,849,079 and 5,772,760. The patents to Gruen et al. describe processes for synthesizing relatively smooth polycrystalline diamond films starting with the mixing of carbonaceous vapors, such as methane or acetylene gas, with a gas stream consisting of mostly an inert or noble gas, such as argon, with, if necessary, also small fractional (1–3%) additions of hydrogen gas. This gas is then activated in, for example, in a microwave plasma environment, and under the appropriate conditions of pressure, gas flow, microwave power, substrate temperature and reactor configuration, nanocrystalline diamond films are deposited on a substrate.

Other related patents relating to diamond deposition are U.S. Pat. No. 5,209,916 to Gruen; U.S. Pat. No. 5,328,676 to Gruen; U.S. Pat. No. 5,370,855 to Gruen; U.S. Pat. No. 5,462,776 to Gruen; U.S. Pat. No. 5,620,512 to Gruen; U.S. Pat. No. 5,571,577 to Zhang et al; U.S. Pat. No. 5,645,645 to Zhang et al; U.S. Pat. No. 5,897,924 to Ulczynski et al and U.S. Pat. No. 5,902,640 to Krauss, as well as numerous patents to Asmussen which are all incorporated by reference herein.

U.S. Pat. Nos. 6,106,692 to Kunimatsu et al; and U.S. Pat. No. 5,900,127 to Iida et al describe conductive diamond electrodes. G. M. Swain (Wang, J., et al., *J. New Mater. Electrochem. Syst.* 3 75 (2000) and Wang, J., et al., *Electrochem. Solid-State Lett.*, 3 286 (2000)) describe electrodes with embedded platinum particles produced by magnetron sputtering.

Electrodes consisting of supported metal catalysts are used in a number of industrial processes (e.g., electrosynthesis) and electrochemical energy conversion devices (e.g., fuel cells). The metal catalysts are typically impregnated into the porous structure of several types of $sp^2$ bonded carbon materials; chemically or physically activated carbon, carbon black, and graphitized carbons. Activated carbon is the most common type of support, at least in part because of the material's chemical stability in acidic and alkaline environments. The primary role of the support is to finely disperse and stabilize small metallic particles, and thus provide access to a much larger number of catalytically active atoms than in the bulk metal even when the latter is ground into a fine powder (Auer, W., et al., *Appl. Catal.*, A, 173 259 (1998)). Several properties of the support are important; among them porosity, pore size distribution, crush strength, surface chemistry, and microstructural and morphological stability.

The present invention uses electrically conducting diamond thin films (Wang, J., et al., *J. New Mater. Electrochem. Syst.*, 3 75 (2000); Wang, J., et al., *Electrochem. Solid-State Lett.*, 3, 286 (2000); and Witek, M., et al., *J. Wide Bandgap Mater. Vol.* 8 No. 3–4 171–188 (January/April 2001)). The use of electrically conducting microcrystalline and nanocrystalline diamond electrodes in electrochemistry is a relatively new field of research (Xu, J., et al., *Anal. Chem.* 69, 591A (1997); Swain, G. M., et al., *MRS Bull.*, 23, 56 (1998); Tenne, R., et al., *Isr. J. Chem.* 38 57 (1998); Pleskov, Y. V., *Russian Chemical Reviews* 68 381 (1999); Vinokur, N., et al., *J. Electrochem. Soc.* 143 L238 (1996); and Rao, T. N., et al., *Anal. Chem.* 71 2506 (1999)). The properties of this new electrode material make it ideally suited for electrochemical applications, particularly demanding ones (i.e., complex matrix, high current density, and potential, high temperature, extremes in pH, and the like). Recent work has shown that nanometer-sized dispersions of Pt can be incorporated and anchored into the surface microstructure of boron-doped microcrystalline diamond thin film electrodes (Wang, J., et al., *J. New Mater. Electrochem. Syst.*, 3, 75 (2000); Wang, J., et al., *Electrochem. Solid-State Lett.*, 3 286 (2000); and Witek, M., et al., *J. Wide Bandgap Mater. Vol.* 8 No. 3–4 171–188 (January/April 2001)). The diamond film serves as a host for the catalyst particles providing electrical conductivity (est., 0.1 $\Omega$cm), thermal conductivity, and dimensional stability. The microstructure and morphology of the diamond, as well as the electrocatalytic activity of the Pt particles, were observed to be very stable during extended electrolysis as no degradation of either was detected after 2000 potential cycles between the hydrogen and oxygen evolution regimes in 0.1 M $HClO_4$ at room temperature (1–6 $mA/cm^2$) (Wang, J., et al., *Electrochem. Solid-State Lett.*, 3 286 (2000)). Importantly, the metal catalyst exposed at the surface is in electronic communication with the current collecting substrate through the boron-doped diamond film, and is electroactive for the underpotential deposition of hydrogen (Wang, J., et al., *J. New Mater. Electrochem. Syst.*, 3, 75 (2000); Wang, J., et al., *Electrochem. Solid-State Lett.*, 3 286 (2000); and Witek, M., et al., *J. Wide Bandgap Mater. Vol.* 8 No. 3–4 171–188 (January/April 2001)), the reduction of oxygen, and the oxidation of methanol (Wang, J., et al., *J. New Mater. Electrochem. Syst.*, 3 75 (2000); and Wang, J., et al., *Electrochem. Solid-State Lett.*, 3 286 (2000)).

Given the corrosion susceptibility of conventional carbon support materials, there is a technological need for advanced support materials that are morphologically and microstructurally stable during exposure to aggressive chemical and electrochemical environments.

OBJECTS

It is therefore an object of the present invention to provide a novel process and diamond electrode produced thereby. These and other objects will become increasingly apparent by reference to the following description.

SUMMARY OF THE INVENTION

The present invention relates to a process for the production of a diamond electrode which comprises: providing a first diamond support, doped with at least one element so as to be electrically conductive; electrodepositing particles of a conductive metal as a coating on the diamond support; and depositing a diamond film on the diamond support and around the particles of the conductive metal to surround and anchor the particles and to produce the diamond electrode wherein the particles are conductive through the support.

Figure 1:
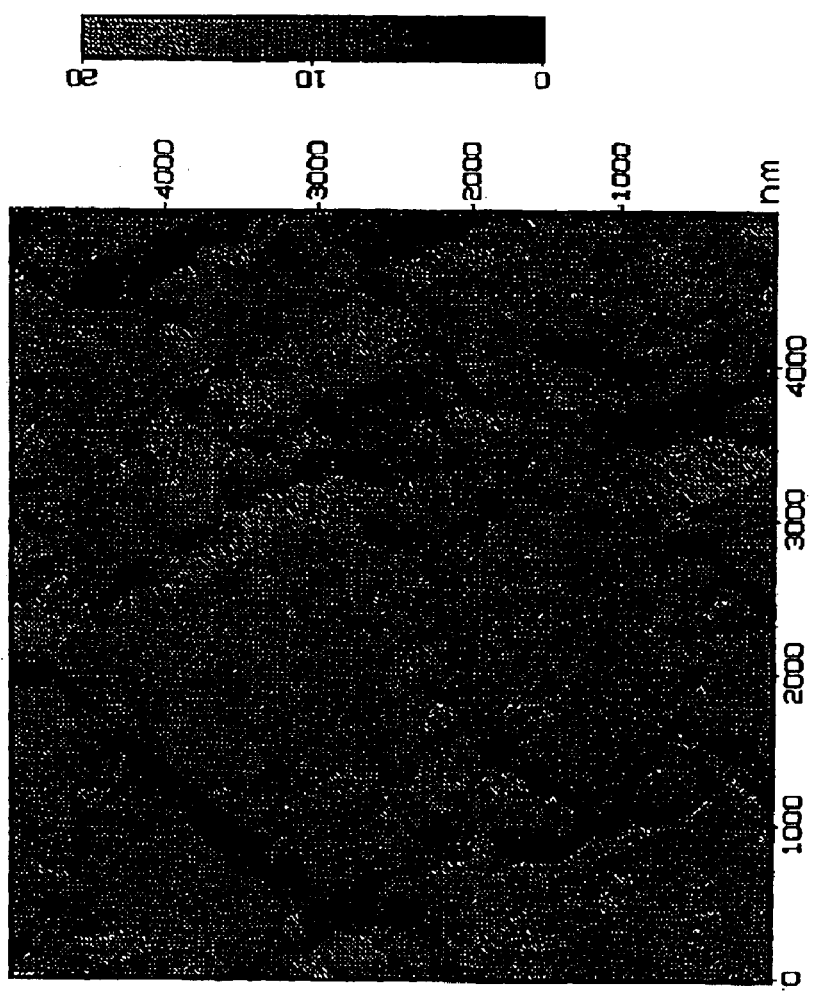
FIG. 1 are AFM images showing 10 to 500 nm diameter (spherical) Pt particles incorporated into the diamond surface microstructure with smaller diamond particles on the triangular diamond microcrystallite surfaces and larger particles in the grain boundaries between the microcrystallites.

The present invention relates to a process for the production of a diamond electrode which comprises:

providing a first diamond film, doped with at least one element, such as boron, so as to be electrically conductive, on an electrically conductive substrate;

electrodepositing particles of a conductive metal, such as platinum, as a coating on the diamond film; and depositing a second diamond film on the first diamond film and around the particles of the conductive metal for the purpose of surrounding the metal particles to anchor the particles and to produce the diamond electrode wherein the metal particles are in good electrical communication with the conductive substrate through the electrically conducting diamond film. It was unexpected that the electrolytically deposited particles of the metal would be anchored securely by this method. A representative diamond film is shown in FIG. 1.

The present invention also relates to a diamond electrode which comprises:

a first polycrystalline diamond support, doped with at least one element so as to be electrically conductive;

particles of a conductive metal which have been electrodeposited as a coating on the diamond support; and a polycrystalline diamond film deposited on the diamond support and around the particles of the conductive metal to surround and anchor the particles to thereby provide the conductive electrode.

The present invention also relates to a diamond electrode which comprises:

a first polycrystalline diamond film doped with at least one element so as to be electrically conductive;

particles of a conductive metal which have been electrodeposited as a coating on the first diamond film; and a second polycrystalline diamond film deposited on the first diamond film and around the particles of the conductive metal to surround and anchor the particles to thereby provide the conductive electrode.

The "electrically conductive substrate" can have any shape (such as planar or curved) and be in the form of a low surface area planar substrate or a high surface area substrate as a mesh, foam or particle substrate. The substrate can also be a composite of multiple electrically conductive substrate.

The electrically conductive diamond can be a composite of various layers or forms of diamond alone (such as nanocrystalline or single crystal diamond) or with carbon in different forms. All of these forms of diamond (including diamond-like carbons) are well known to those skilled in the art.

Preferably the particles of metal are platinum. Also preferably the doping element is boron. The diamond films are preferably deposited by chemical vapor deposition. The chemical vapor deposition is preferably accomplished by microwave activation in the presence of methane and hydrogen at reduced pressures. Preferably electrodeposition is of a metal halide salt which is reduced to the metal. Preferably the conductive metal particles are irregularly spherical in shape. Most preferably the electrodeposition is from a platinum halide salt in the presence of perchloric acid.

Thus the objective of this invention is a new electrocatalytic electrode with extreme microstructural and morphological stability to be used for electrosynthesis, electrochemical-based toxic waste remediation and energy conversion devices. This dimensional stability allows the electrode to be stably operated under extreme conditions (e.g., acidic or caustic solutions, high current density (>0.1 A/cm$^2$) and high temperature (>150° C.)). The platform for the invention is an electrically conducting diamond thin film in which nanometer-sized particles of Pt have been incorporated. The dispersed metal particles are incorporated into the surface microstructure of the diamond and exposed such that the electrodes are active for the generation of hydrogen gas, the reduction of oxygen gas and the oxidation of methanol. The preferred embodiment is referred to as a Pt/diamond composite electrode. An atomic force microscope image of the composite electrode is shown in FIG. 1.

Electrodes consisting of supported metal catalysts are used in a number of industrial processes (e.g., electrosynthesis) and electrochemical energy conversion devices (e.g., fuel cells). The metal catalysts are typically impregnated into the porous structure of several types of sp$^2$ bonded carbon materials: chemically or physically activated carbon, carbon black and graphitized carbons. The advantage of the Pt/diamond composite electrode is the extreme dimensional stability of the diamond host/support. The composite electrode can operate stably under harsh electrochemical conditions, such as extremes in solution pH, high temperature and high current density; conditions under which commercial sp$^2$ carbon supports fail catastrophically. The metal catalyst particles are physically anchored within the diamond such that they do not agglomerate or come detached during high density electrolysis (0.1 A/cm$^2$).

Several markets benefit from this invention, in particular, companies manufacturing electrolyzers to generate chlorine or ozone, and reactors to electrochemically remediate toxic waste. Companies marketing dimensionally stable electrodes for electrosynthesis could also benefit from this technology. Finally, companies manufacturing and marketing small-scale fuel cells would be interested in this technology.

Figure 2:
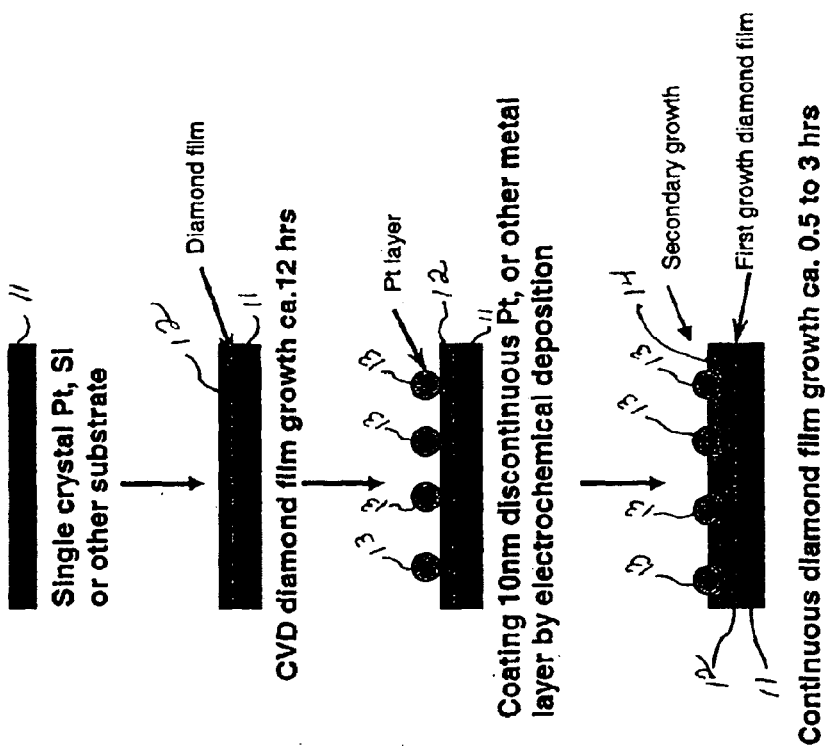
FIG. 2 is a schematic diagram showing the steps in the process to form the diamond electrode containing particles of platinum anchored by diamond particles.
Figure 2A:
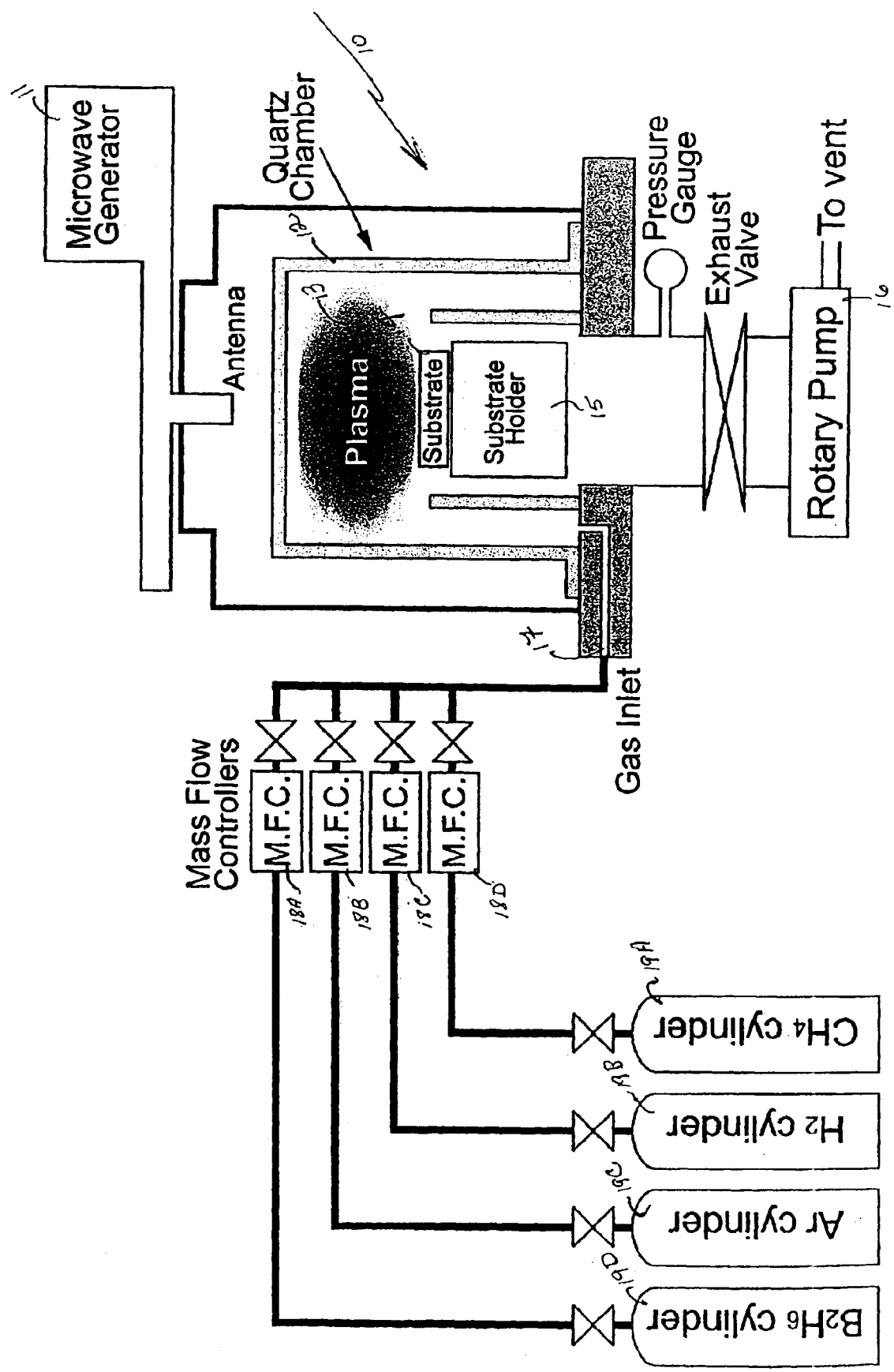
FIG. 2A is a schematic diagram of the apparatus 10 used in the process of FIG. 2. In a particular example, $C_M$ (methane) was 0.3%, P was 60 torr, $T_s$ (stage) was 875° C., and B/C was ~0.1% by above concentrations.

The composite electrodes are fabricated by a multistep process that is illustrated in the second attached FIG. 2. A boron doped first diamond film 12 is grown on a P—Si or platinum substrate 11. Platinum (Pt) is electrolytically deposited on the film 12 as irregular microspheres. A second boron doped diamond film 14 is then grown around the Pt to anchor the Pt on the first film 12. FIG. 2A shows a side view of a microwave CVD reactor 10. In FIG. 2A the following elements are present:
10—reactor
11—microwave generator and antenna
12—quartz chamber
13—plasma
14—substrate
15—substrate holder
16—vacuum pump
17—gas inlet
18A to 18D—mass flow controllers
19A to 19D—gas cylinders
Such a reactor 10 is well known to those skilled in the art.

Working forms of the Pt/diamond composite electrodes were fabricated. The electrodes fabricated all used electrically conducting silicon substrates. The diamond particle size ranges from 30 to 300 nm with a particle distribution of about 2.5×10$^8$/cm$^2$. The electrode response toward hydrogen evolution, oxygen reduction and methanol oxidation was evaluated, as were several aspects of the dimensional stability during exposure to harsh electrochemical conditions and found to be satisfactory.

The nominal diamond particle size is preferably between 10 and 50 nm. The present invention contemplates fabricating the composite electrodes in a cost effective manner, and advancing the technology so as to coat high surface area metal mesh supports. Finally, the incorporation of Pt/Ru and Pt/Os metal alloy particles can be accomplished.

In summary, dimensionally stable Pt/diamond composite electrodes have been developed for use in electrosynthesis, electrochemical-based toxic waste remediation and energy conversion devices. The dimensionally stable and corrosion resistant electrodes consist of well-faceted microcrystallites with dispersed Pt particles incorporated into the surface region. The metal particles are well anchored and range from 30 to 300 nm with a distribution of about 2.5×10$^8$/cm$^2$. Importantly, the Pt particles at the surface are in communication with the current collecting substrate through the boron-doped diamond matrix, and they are electroactive for the underpotential deposition of hydrogen, the reduction of oxygen and the oxidation of methanol. The dispersed Pt particles are extremely stable as no loss in activity is observed after 2000 potential cycles between the hydrogen and oxygen evolution regimes in 0.1 M HClO$_4$ (1–6 mA/cm$^2$). The composite electrode is also extremely stable during anodic polarization in 85% H$_3$PO$_4$ at 170° C. and 0.1 A/cm$^2$. The composite electrodes exhibit no evidence of any morphological or microstructural damage, and more importantly, no evidence of any catalyst activity loss for hydrogen evolution or oxygen reduction during exposure to the extreme conditions.

The diamond films are conductive because they are doped with a conductive element (such as boron). The diamond is doped at a level of 0.1% by atomic concentration (B/C) or higher, where p-Si is used as a substrate rather than platinum, then the p-Si is doped at a level of about 0.05 to 0.1% by atomic concentration boron.

The metal particles are preferably comprised of a metal in Group VIIIB. Particularly preferred are Pt, Rh and/or Ru and alloys thereof. The metal particles are generally irregularly spherical in shape since the metal particles are formed by an isolated nucleation and growth mechanism. Obviously the particles have irregular spherical shapes.

DESCRIPTION OF PREFERRED EMBODIMENTS

The morphological and microstructural stability, as well as the catalytic activity of a Pt/diamond composite electrode during two 1 h periods of anodic polarization in 85% H$_3$PO$_4$ at 170° C. and 0.1 A/cm$^2$, were investigated. The composite electrode consisted of an electrically conducting diamond thin film support with Pt metal particles entrapped in the surface microstructure by diamond particles. The Pt particles range in diameter from 30 to 300 nm with a distribution of about 2×10$^8$ cm$^{-2}$. No evidence of morphological of microstructural damage, and, more importantly, no loss of catalyst activity for hydrogen evolution or oxygen reduction was observed after the harsh electrolysis. A Pt-impregnated sp$^2$ carbon cloth electrode was observed to catastrophically fail during the first hour of electrolysis.

A stability test was conducted of the Pt/diamond composite electrode more demanding than any which has been published (Swain, G. M., *J. Electrochem. Soc.*, 141 3382 (1994); and Chen, Q., et al., *J. Electrochem. Soc.*, 144 3806 (1997)), exposure to 85% phosphoric acid at 170° C. for 2 h at an anodic current density of 0.1 A/cm$^2$. The electrode morphology and microstructure were evaluated before and after the electrolysis using optical microscopy, atomic force microscopy (AFM), and Raman spectroscopy. The electrocatalytic activity of the metal catalyst was examined before and after using cyclic voltammetry (CV) in 0.1 M HClO$_4$. A commercial Pt-impregnated sp$^2$ carbon cloth electrode having a loading of 0.5 mg/cm$^2$ and a nominal catalyst size of 2 nm was exposed to the same electrolysis conditions. The purpose for this was to compare the performance of the Pt/diamond composite electrode with that of a "real world," sp$^2$ carbon-supported catalytic electrode.

EXAMPLE

Experimental

The boron-doped diamond thin films were deposited on p-Si (100) substrates (<0.01 Ω cm) using microwave-assisted chemical vapor deposition (CVD) (1.5 kW, 2.54 GHz, Astex, Inc., Lowell, Mass.). Details of the deposition procedure have been presented elsewhere (Wang, J., et al., *J. New Mater. Electrochem. Syst.*, 3 75 (2000); and Wang, J., et al., *Electrochem. Solid-state Lett.*, 3 286 (2000)). The composite electrodes were prepared by initially depositing a ca. 3 μm thick boron-doped film for 12 h using a CH$_4$/H$_2$ volumetric ratio of 0.35%. The microwave power was 1000 W, the pressure was ca. 40 to 60 Torr and the substrate temperature was ca. 875° C. The diamond growth was then stopped and the substrates cooled to less than 300° C. in the presence of atomic hydrogen. After cooling to room temperature, the film-coated substrates were removed from the reactor and a discontinuous layer of Pt particles was electrodeposited. The metal was electrodeposited from 1 mM $K_2PtCl_6$+0.1M $HClO_4$ using a constant current of 100 μA (500 μA/cm$^2$) and a variable deposition time from 100 to 500 s. The Pt-coated films were then placed back in the CVD reactor and boron-doped diamond was deposited for an additional 3 h using the same conditions as described above. This second deposition results in diamond film growth around the metal particles securely anchoring them into the surface microstructure. The final Pt particles range in diameter from 30 to 300 nm with a distribution of about 2×10$^8$ cm$^{-2}$. These particles are larger than desired for a catalytic electrode (~5 nm diam optimum). The control of the metal particle size to less than 50 nm is easily within the skill of the art.

The film morphology was investigated with AFM using a Nanoscope II instrument (Digital Instruments, Santa Barbara, Calif.) operated in the contact mode. Pyramidal-shaped $Si_3N_4$ tips mounted on gold cantilevers (100 μm legs, 0.38 N/m spring constant) were used to acquire topographical images in air.

The film microstructure was assessed with Raman spectroscopy. The spectra were obtained at room temperature with a Chromex 2000 spectrometer (Chromex, Inc., Albuquerque, N. Mex.) using laser excitation at 532 nm, a monochromator slit width of 5 μm, and integration time of 10 s. The spectrometer was equipped with a 1026×200 element charge-coupled device (CCD) detector. A white light spectrum was collected under the same conditions and used to ratio the spectra. The laser power at the sample was ca. 30 mW, as measured with a thermopile detector.

Figure 7:
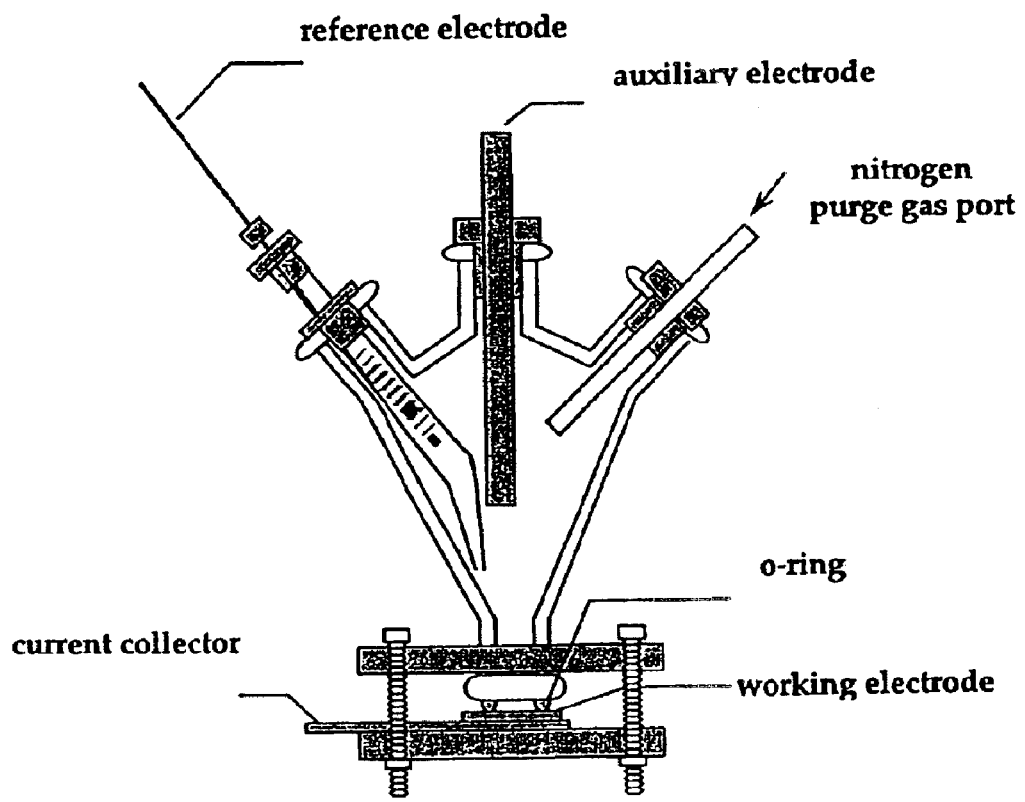
FIG. 7 is a schematic front view of the cell used in the example.

The anodic polarization was performed in 85% $H_3PO_4$ (ultrapure grade, Aldrich Chemical) at 170° C. A partially sealed single compartment, three-electrode cell, as shown in FIG. 7, was placed inside an oven to regulate the temperature. The entire oven was placed inside a fume hood to exhaust any released acid vapors. An anodic current density of 0.1 A/cm$^2$ was applied for two 1 h periods. The same anodic polarization was performed using a Pt-impregnated commercial sp$^2$ carbon cloth electrode. The new electrode had a 0.5 mg/cm$^2$ Pt loading (2 nm diam particles) with 0.2 cm$^2$ geometric area exposed to the 85% $H_3PO_4$ solution at 170° C. Significant gas evolution (i.e., oxygen evolution) occurred at both electrodes during the electrolysis. The potential of the Pt/diamond composite electrode was stable at ca. 2.52 V vs. the carbon rod counter electrode during the 2 h electrolysis. The potential for the carbon cloth electrode progressively increased from 2.42 to 3.92 V during the first hour of electrolysis. For reference, the equilibrium potential of the carbon rod vs. Ag/AgCl in the electrolysis solution at room temperature was 0.080 V. These two observations reflect the stability of the Pt/diamond composite electrode and the instability of the sp$^2$ carbon cloth electrode, as discussed below. Background cyclic voltametric i-E curves in 0.1 M $HClO_4$ (ultrapure grade, Aldrich Chemical) were recorded for each electrode, before and after the anodic polarization, to check for changes in the catalyst activity. All solutions were prepared with ultrapure water (Barnstead E-Pure, 18 MΩ-cm).

The Pt electrodeposition, anodic polarization, and CV were performed with a CS-2000 digital potentiostat/galvanostat (Cypress Systems Inc., Lawence, Kans.). A Ag/AgCl (saturated KCl) electrode was used as the reference and a large-area carbon rod served as the counter electrode. The Pt/diamond composite electrodes were pressed against the bottom of the glass cell using an Al plate current collector with the fluid being contained by a Viton O-ring. A small section of the back side of the Si substrate was scratched, cleaned with isopropanol, and coated with Ag paste before making ohmic contact with the Al plate. The exposed geometric area was 0.2 cm$^2$ and all currents are normalized to this area. While mounted in the cell, the composite electrodes were sequentially rinsed with ultrapure water, soaked for 20 min in distilled isopropanol, and then rinsed with ultrapure water. The electrolyte solution was deoxygenated with nitrogen (BOC Gases) for 20 min prior to any of the voltametric measurements. All the voltametric characterizations were done at room temperature (22–24° C.).

Results and Discussion

Figure 3:
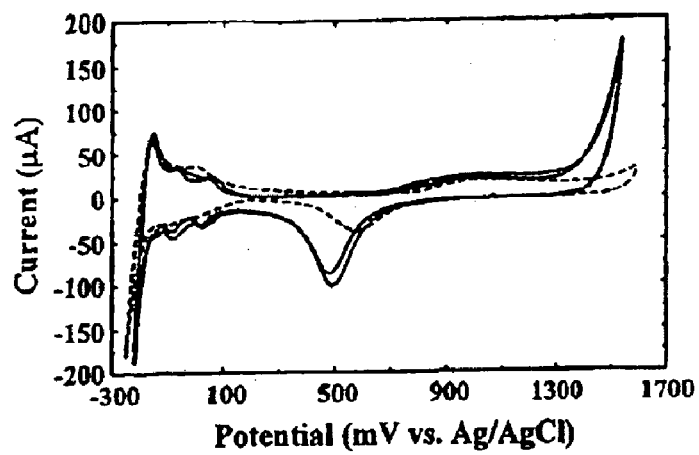
FIG. 3 is a graph showing CV i-E curves for a Pt/diamond composite electrode in 0.1 M $HClO_4$ before (dashed line) and after two 1 h polarizations (solid lines) in 85 wt % $H_3PO_4$ at 170° C., and an anodic current density of 0.1 A/cm$^2$.

FIG. 3 shows CV i-E curves for a Pt/diamond composite electrode in 0.1 M $HClO_4$ before and after two 1 h periods of anodic polarization. As stated above, the polarization was performed in 85% $H_3PO_4$ at 170° C. and a current density of 0.1 A/cm$^2$. The curve for the electrode prior to the polarization (dashed line) reveals the presence of Pt with the expected features; Pt oxide formation, Pt oxide reduction, the adsorption and desorption of underpotential deposited hydrogen and hydrogen evolution. Well-resolved and symmetrical features are observed for hydrogen ion adsorption and desorption between 100 and −100 mV. The current in the Pt oxide formation region, beginning at ca. 700 mV, is flat and featureless indicative of a clean and contaminant-free surface, at least for electroactive contaminants at these potentials. The reduction of Pt oxide occurs at ca. 550 mV. These voltametric features were stable with multiple scans.

After the two 1 h polarizations, the voltametric features are unchanged and clearly reveal that there is no loss of catalyst activity due to degradation of the diamond microstructure and morphology. All the characteristic Pt voltametric features are present. Importantly, there is no loss in the charge associated with hydrogen ion adsorption and desorption. Such loss would be expected if the Pt catalyst particles were detached from the surface due to an oxidizing and corroding diamond support. In fact, the charge associated with the hydrogen ion adsorption actually increased after the electrolysis. The cathodic charge between 100 and −100 mV was 355 μC/cm$^2$ before and increased to 420 and 455 μC/cm$^2$ after the two 1 h polarizations, respectively. The increased charge was attributed to minor surface cleaning and crystallographic changes in the deposits that occur during the vigorous gas evolution.

Figure 4A:
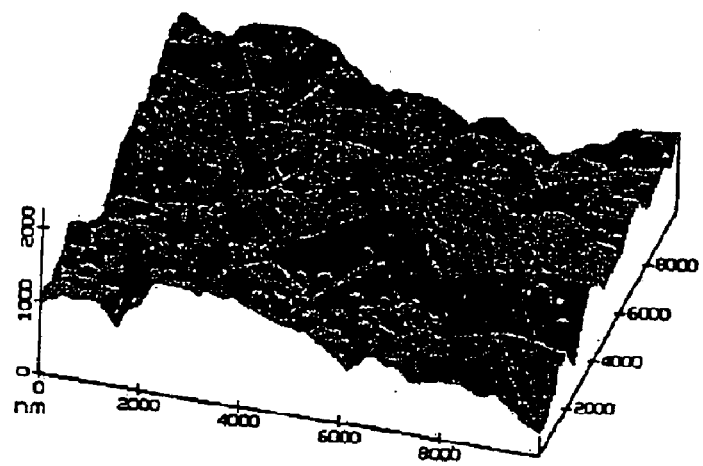
FIGS. 4A and 4B are images (in air) of a Pt/diamond composite electrode (FIG. 4A) before and (FIG. 4B) after anodic polarization in 85 wt % $H_3PO_4$ at 170° C. and an anodic current density of 0.1 A/cm$^2$.
Figure 4B:
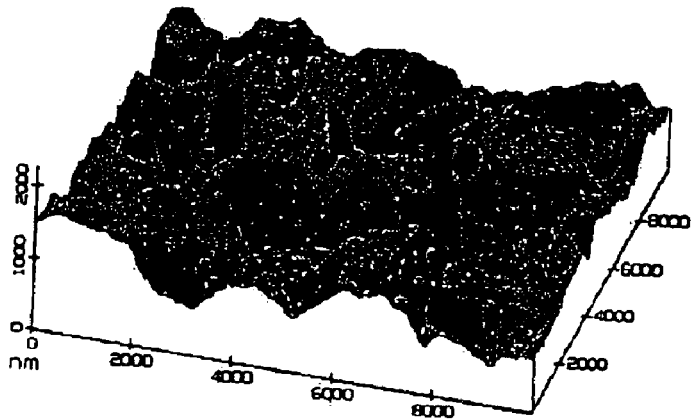

One type of minor cleaning that is possible is the oxidative removal of residual carbon deposits formed during the diamond deposition. These deposits do not affect the stability of the metal particles but, rather, influence their surface activity toward faradaic electron transfer processes. There is no significant change in the particle size and coverage after polarization, at least as revealed by AFM. Some representative images are shown in FIGS. 4A and 4B. The most significant change in the voltammograms is the reduced overpotential for oxygen evolution after the polarizations. The current associated with the reduction of this oxygen is superimposed on the Pt-oxide reduction current at ca. 550 mV, and this causes the current maximum to shift to slightly more negative potentials. There is also a minor decrease in the overpotential for hydrogen evolution after the polarization.

FIGS. 4A and 4B show ex situ AFM images of the Pt/diamond composite electrode before and after the two 1 h polarizations. A well-faceted, polycrystalline morphology is observed before and after electrolysis. The crystallites are randomly oriented with spherical Pt dispersions decorating both the facets and grain boundaries. Clearly, there is no evidence of any morphological or microstructural damage, such as film delamination, grain roughening, or pitting. The similarity of the image features before and after polarization is consistent with the CV data.

Raman measurements were also made on the composite electrodes before and after polarization. No significant spectral changes were observed consistent with a stable microstructure and near-surface optical properties. The diamond line position was upshifted from that observed for a piece of high pressure, high temperature diamond by 1 cm$^{-1}$ or less. The line position, linewidth, line intensity, and photoluminescence background were unchanged after the polarization.

Figure 5A:
FIGS. 5A and 5B are optical micrographs of a commercial sp$^2$ carbon cloth electrode impregnated with Pt (FIG. 5A) before and (FIG. 5B) after a 1 h anodic polarization in 85 wt % $H_3PO_4$ at 170° C. and an anodic current density of 0.1 A/cm$^2$. Images of a treated (left) and untreated electrode (right) are shown in FIG. 5A.
Figure 5B:
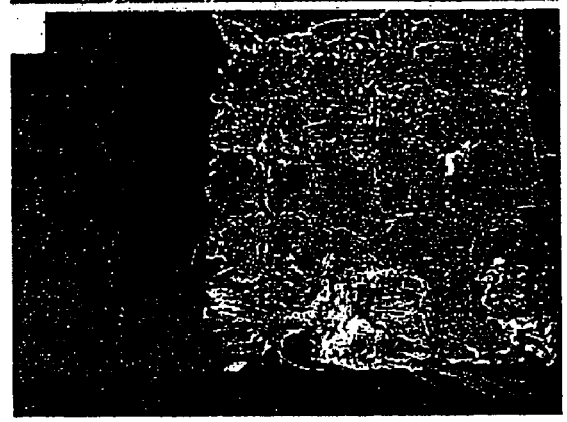

Optical micrographs of a Pt-impregnated sp$^2$ carbon cloth electrode after a 1 h polarization are presented in FIGS. 5A and 5B. FIG. 5A shows images of the treated electrode on the left and the untreated electrode on the right. FIG. 5B shows a larger area of the treated electrode. The physical integrity of the electrode was catastrophically damaged due to the oxidation of the carbon support. The physical evidence for major morphological and microstructural damage was loose pieces of the electrode floating in the solution, lost portions of the electrode, especially at the edges due to oxidation and gasification reactions, and lost catalyst activity.

Figure 6:
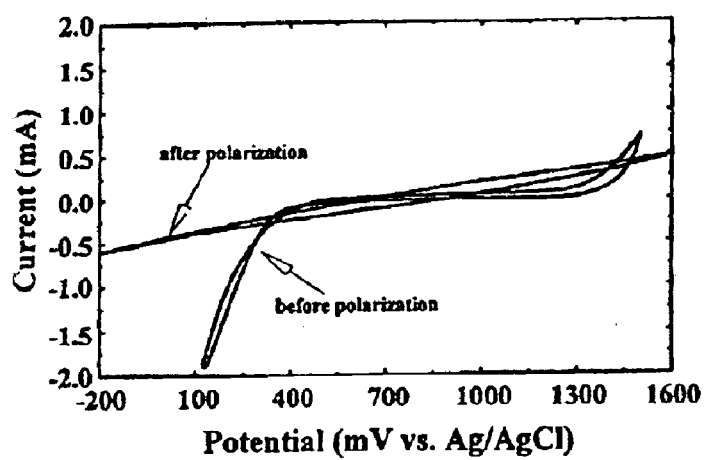
FIG. 6 (prior art) is a graph showing CV i-E curves for the sp$^2$ carbon cloth electrode impregnated with Pt in 0.1 M $HClO_4$ before and after a 1 h polarization in 85 wt % $H_3PO_4$ at 170° C. and an anodic current density of 0.1 A/cm$^2$.

FIG. 6 shows background CV i-E curves for the carbon cloth electrode in 0.1 M HClO$_4$ before and after a 1 h polarization. It was previously reported that diamond electrodes exhibit superior dimensional stability to other sp$^2$ carbon electrodes (e.g., glassy carbon, Grafoil, and highly oriented pyrolytic graphite) during less vigorous electrolysis conditions than those employed herein, for example, in acidic fluoride media (Swain, G. M., *J. Electrochem. Soc.* 141 3382 (1994)). The well-resolved features characteristic of Pt were not observed prior to the polarization even with extensive cycling. However, the characteristic low overpotentials for oxygen and hydrogen evolution are evident as the onset potentials for the anodic and cathodic current are 1300 and 300 mV, respectively. There is little evidence of any catalyst activity after the polarization. The currents for oxygen and hydrogen evolution decrease substantially and the electrode response resembles that expected for a pure resistance. Consistent with this loss of catalytic activity is the observation that the electrode potential progressively increases from 2.5 to 4.0 V during electrolysis. Therefore, it can be concluded that the polarization causes oxidation and corrosion of the carbon support to such an extent that the catalyst is lost and the electrode's electrical resistance is increased.

The above example shows the Pt/diamond composite electrode exhibited superb morphological and microstructural stability during vigorous electrolysis in acidic media at high temperature and current density. There was no degradation of the diamond electrode, nor was there any loss in catalytic activity for hydrogen evolution or oxygen reduction. The Pt catalyst dispersions are physically entrapped within the dimensionally surface microstructure of the diamond lattice and are not detached during the high current density electrolysis in hot phosphoric acid.

This technology allows deposition of the films in an economic and cost effective manner, deposition of the films on higher surface area metal meshes, and by incorporation of other interesting metal catalyst particles, like Pt/Ru alloys.

It is intended that the foregoing description be only illustrative of the present invention and that the present invention be limited only by the hereinafter appended claims.

We claim:

1. A process for the production of a diamond electrode which comprises:

(a) providing a first diamond support, doped with at least one element so as to be electrically conductive;

(b) electrodepositing particles of a conductive metal with electrocatalytic activity on the diamond support, wherein the particles are irregularly spherical in shape and are dispersed over a surface of the support; and (c) depositing a diamond film on the surface of the diamond support and around the particles of the conductive metal to surround and anchor the particles on the support and to produce the diamond electrode wherein the particles are conductive through the support.

2. The process of claim 1 wherein the particles of metal are platinum.

3. The process of claim 1 wherein the element is boron.

4. The process of claim 1 wherein the diamond support and film are deposited by chemical vapor deposition.

5. A process for the production of a diamond electrode which comprises:

(a) providing a first diamond film, doped with at least one element so as to be electrically conductive, on an electrically conductive substrate;

(b) electrodepositing particles of a conductive metal with electrocatalytic activity on the diamond film, wherein the particles are irregularly spherical in shape and are dispersed over a surface of the support; and (c) depositing a second diamond film on the surface of the first diamond film and around the particles of the conductive metal to surround anchor the particles on the support and to produce the diamond electrode wherein the particles are conductive through the substrate.

6. The process of claim 5 wherein the particles of metal are platinum.

7. The process of claim 5 wherein the element is boron.

8. The process of claim 5 wherein the first and second diamond films are deposited by chemical vapor deposition.

9. The process of claim 8 wherein the chemical vapor deposition accomplished by microwave-assisted activation of the deposition gases, methane and hydrogen, at reduced pressures.

10. The process of claim 5 wherein the metal has been electrodeposited by electrolyzing a metal halide salt which is reduced to the metal.

11. The process of claim 5 wherein the metal has been electrodeposited by electrolyzing a platinum halide salt in the presence of perchioric acid.

* * * * *